(12) United States Patent
Mohajeri et al.

(10) Patent No.: US 8,446,219 B2
(45) Date of Patent: May 21, 2013

(54) CLASS-G LINE DRIVER CONTROL SIGNAL

(75) Inventors: Hessam Mohajeri, Los Altos Hills, CA (US); Amir H. Fazlollahi, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 363 days.

(21) Appl. No.: 12/697,913

(22) Filed: Feb. 1, 2010

(65) Prior Publication Data

US 2010/0321115 A1 Dec. 23, 2010

Related U.S. Application Data

(60) Provisional application No. 61/187,948, filed on Jun. 17, 2009.

(51) Int. Cl.
*H03F 3/20* (2006.01)

(52) U.S. Cl.
USPC .......................................... 330/136; 330/297

(58) Field of Classification Search
USPC ................................................ 330/136, 297
See application file for complete search history.

(56) References Cited

U.S. PATENT DOCUMENTS

| | | | |
|---|---|---|---|
| 4,873,493 A | 10/1989 | Fujiwara | |
| 6,028,486 A | 2/2000 | Andre | |
| 6,323,733 B1 | 11/2001 | Gorcea et al. | |
| 6,614,310 B2 * | 9/2003 | Quarfoot et al. | 330/297 |
| 6,646,501 B1 | 11/2003 | Wessel | |
| 7,031,457 B2 | 4/2006 | Melsa | |
| 8,072,266 B1 * | 12/2011 | Hoomes et al. | 330/251 |
| 2001/0004387 A1 | 6/2001 | Barkar | |
| 2005/0242880 A1 | 11/2005 | Domokos et al. | |
| 2005/0261898 A1 | 11/2005 | Van Klinken | |

FOREIGN PATENT DOCUMENTS

| | | |
|---|---|---|
| CN | 1411648 A | 4/2003 |
| CN | 1663115 A | 8/2005 |
| CN | 1675827 A | 9/2005 |

(Continued)

OTHER PUBLICATIONS

"Series-G Transmission Systems and Media, Digital Systems and Networks Digital Sections and Digital Line System-Access Networks; Very High Speed Digital Subscriber Line Transceivers 2 (VDSL2)," ITU-T G.993.2 (Feb. 2006).

(Continued)

*Primary Examiner* — Robert Pascal
*Assistant Examiner* — Khiem Nguyen
(74) *Attorney, Agent, or Firm* — Conley Rose, P.C.; Grant Rodolph; Clint Wilkins

(57) ABSTRACT

An apparatus comprising an input, a control signal generator coupled to the input and having a control signal generator output, and an amplifier coupled to the control signal generator output, wherein a voltage supplied to the amplifier is switched based on the control signal generator output, and wherein the control signal generator output is based on a data signal in the input. Also included is an apparatus comprising circuitry configured to implement a method comprising detecting an incoming signal, calculating a derivative of the incoming signal, estimating a future incoming signal based on the derivative of the incoming signal and a time step, and providing the estimated future incoming signal to switch between a first supply voltage and a second supply voltage prior to or concurrent with an arrival of the future incoming signal at the switch, wherein the incoming signal and the future incoming signal are analog signals.

17 Claims, 13 Drawing Sheets

FOREIGN PATENT DOCUMENTS

| | | |
|---|---|---|
| EP | 0522528 A1 | 1/1993 |
| EP | 1317105 A1 | 6/2003 |
| EP | 1811651 A1 | 7/2007 |

OTHER PUBLICATIONS

"Series-G Transmission Systems and Media, Digital Systems and Networks Digital Sections and Digital Line System-Access Networks; Asymmetric Digital Subscriber Line (ADSL) Transceivers—Extended Bandwidth ADSL2 (ADSL2plus)," ITU-T G.992.5 (Jan. 2009).

Foreign Communication From a Related Counterpart Application, European Application 10788878.6, Supplementary European Search Report dated May 10, 2012, 13 pages.

Foreign Communication From a Related Counterpart Application, PCT Application PCT/CN2010/073693, International Search Report dated Sep. 23, 2010, 6 pages.

Foreign Communication From a Related Counterpart Application, PCT Application PCT/CN2010/073693, Written Opinion dated Sep. 23, 2010, 8 pages.

* cited by examiner

CLASS-G LINE DRIVER CONTROL SIGNAL

CROSS-REFERENCE TO RELATED APPLICATIONS

The present application claims priority to U.S. Provisional Patent Application No. 61/187,948 filed Jun. 17, 2009 by Hessam Mohajeri, et al. and entitled, "Class-G Line Driver Control Signal," which is incorporated herein by reference as if reproduced in its entirety.

STATEMENT REGARDING FEDERALLY SPONSORED RESEARCH AND DEVELOPMENT

Not applicable.

REFERENCE TO A MICROFICHE APPENDIX

Not applicable.

BACKGROUND

In a communication system, analog and/or digital signals are converted into a final format that can be transported through the communication channel media. Depending on the channel media, the final signal format will differ. For example, in wired communication systems, a power amplifier may be used to transmit analog signals into a final communication media, such as a copper wire or optical fiber. In wireless communication systems, a power amplifier may be used to transmit analog signals into air. In the case of wired communication systems, the power amplifier is referred to as a line driver. The line driver is designed to ensure sufficiently low distortion in the signals, e.g. by matching the transmitted signals to the originally generated signals. For some signal formats, such as Discrete Multi-Tone (DMT) signals in Digital Subscriber Line (DSL), the line driver may use the same supply voltage to amplify relatively low and high signal peaks, e.g. in comparison to the average power value of the signal. To handle the high signal peaks, the line driver requires a high supply voltage that is larger than the average signal values, which in return can consume substantial power in the line driver. To reduce the power consumption in the line driver, a class of line drivers referred to as a class-G line driver is used. Instead of using the same supply voltage in a continuous manner, the class-G line driver switches between relatively low and high supply voltages using a control signal based on the incoming signal amplitude. The class-G line driver requires sufficiently accurate control signals to properly switch between the low and high supply voltages and to guarantee signal integrity.

SUMMARY

In one embodiment, the disclosure includes an apparatus comprising an input, a control signal generator coupled to the input and having a control signal generator output, and an amplifier coupled to the control signal generator output, wherein a voltage supplied to the amplifier is switched based on the control signal generator output, and wherein the control signal generator output is based on a data signal in the input.

In another embodiment, the disclosure includes an apparatus comprising circuitry configured to implement a method comprising detecting an incoming signal, calculating a derivative of the incoming signal, estimating a future incoming signal based on the derivative of the incoming signal and a time step, and providing the estimated future incoming signal to switch between a first supply voltage and a second supply voltage prior to or concurrent with an arrival of the future incoming signal at the switch, wherein the incoming signal and the future incoming signal are analog signals.

In yet another embodiment, the disclosure includes a method comprising establishing an analog delay line based on a transfer function for a filter in a line driver, wherein the analog delay line allows a control signal to arrive at about the same time as an incoming signal to the line driver to properly switch a supply voltage of the line driver.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
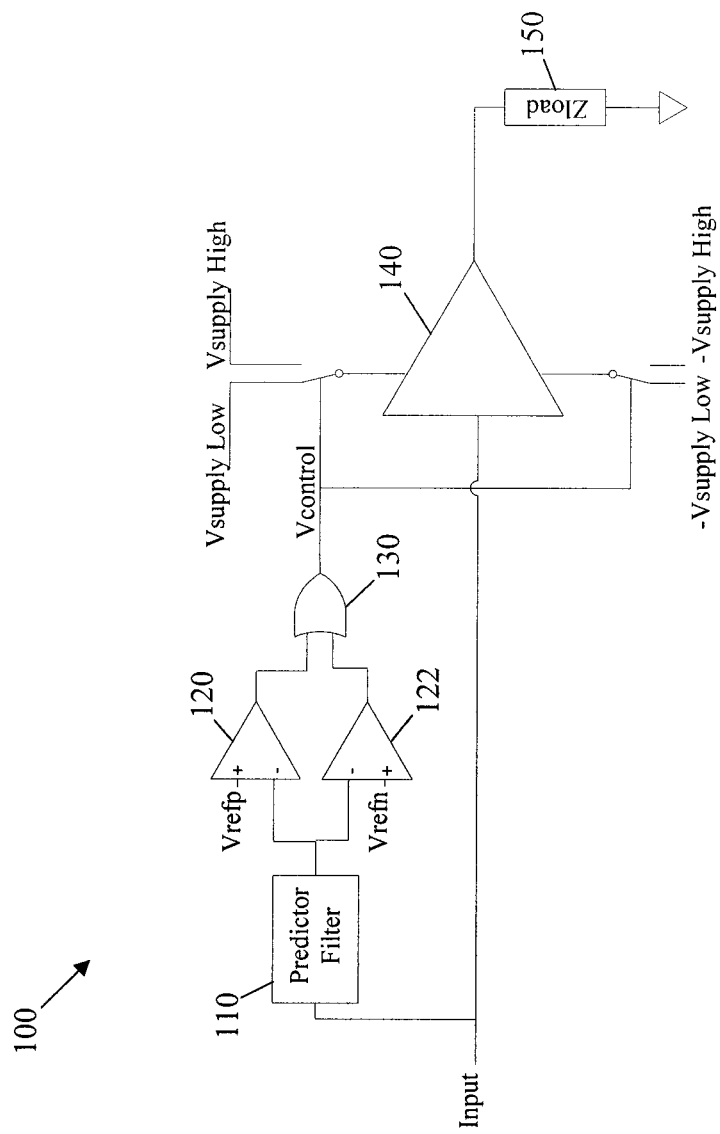
FIG. 1 is a schematic diagram of an embodiment of an amplifier system.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The line driver may be used in a DSL system, where signals (e.g. DMT-modulated signals) may be transmitted over a plurality of subscriber lines, e.g. in an asymmetric DSL (ADSL) or very high bit rate DSL (VDSL) system. The DSL system may comprise a central office (CO) exchange, which may be coupled to a plurality of customer premises equipments (CPEs) via the subscriber lines. The DSL system may also comprise a cabinet site that may be positioned between the CO exchange and at least some of the subscriber lines. The CO exchange, the cabinet site, and/or any of the CPEs may comprise a plurality of transmitters and/or receivers (e.g. transceivers), which may be coupled to or comprise a line driver, such as a class-G line driver. The line driver may be configured to switch between two different power supplies with different voltage values, based on the signal's peak, when transmitting the signal in a corresponding subscriber line. As such, the incoming signal may be amplified part of the time by the line driver using high supply voltage instead of all the time, which reduces power consumption in the line driver.

For instance, the line driver may amplify the incoming signal based on the amplitude of the signal. A control signal may be used to amplify the incoming signal in the line driver by switching a supply power or voltage of the line driver according to the amplitude of the signal crossing a threshold. Accordingly, when the amplitude of the incoming signal exceeds a threshold, the control signal may be provided to switch the line driver from a low supply voltage to a high supply voltage, and hence allow sufficient headroom in the line driver's output voltage swing for the incoming signal. Similarly, when the amplitude of the incoming signal drops below the threshold, the control signal may be provided to switch the line driver from the high supply voltage to the low supply voltage, and hence save power consumption in the line driver. The low and high voltage supplies may be determined based on the characteristics of the load or line, the peak to average ratio (PAR), the transmission technology used, or combinations thereof Typically, signals with high PAR, such as DMT-modulated signals, have a relatively low probability of exceeding a threshold few times larger than average Root Mean Square (RMS) value of the signal, and hence the supply voltage of the line driver may be retained at low voltage for a substantial amount of time and consequently the power consumption in the line may be substantially reduced. For example, the DMT signals in DSL systems may have a PAR equal to about six and may have a relatively low probability (e.g. at about five percent) of exceeding about three times the RMS value of the signals.

Typically, a comparator circuit may be used to switch the supply voltage for the line driver. The comparator may monitor the incoming signals, for instance continuously over time, and provide a control signal to switch the supply voltage to a high voltage value (Vcc-High) when the signal exceeds a threshold. Similarly, the comparator may provide a control signal to switch the supply voltage to a low voltage value (Vcc-Low) when the signal drops below the same or another threshold. The comparator may introduce a delay to the incoming signal, and consequently the line driver may receive the control signal to switch to Vcc-High when it may be too late, e.g. after amplifying the incoming signal. Amplifying the incoming signal before switching the supply voltage properly may cause the line driver to miss to switch to the Vcc-High on time, which may be referred to as a miss-to-trigger-to-VccHigh (Miss-Trigger-L2H) event, that may lead to clipping the corresponding high amplitude signal and distorting the line's communication signal. Receiving the control signal too early, which may be referred to as a false-trigger-to-VccHigh (False-Trigger-L2H) event, does not cause any clipping on the signal to cause error, but will waste power in the line driver. Alternatively, the comparator may receive the control signal to switch to Vcc-Low after amplifying the incoming signal. In this case, the line driver may miss to switch to Vcc-Low on time (switching happens too late), which may be referred to as a miss-to-trigger-to-VccLow (Miss-Trigger-H2L) event, and therefore power may be wasted. A control signal to switch line driver supply voltage from VccHigh to VccLow that arrives too early, which may be referred to as a false-trigger-to-VccLow (False-Trigger-H2L) event, will cause clipping at the line driver output that can cause error in data communication.

The control signal to switch from VccLow to VccHigh and vice versa can be generated in digital domain using the digital transmitted signal. Circuit blocks may be used to compare an incoming digital signal to a threshold to create the control signal for the line driver, then delay the incoming signal (e.g. in a shift register), and then convert the incoming digital signal into an analog signal suitable for transmission, e.g. using a Digital-to-Analog-Converter (DAC). Unfortunately, in this method, since the incoming signal may be processed at a plurality of circuit blocks before amplification, the signal peak and timing (position in time) may change, e.g. due to distortion in the phase response of the circuit blocks. Changes in the signal peak and/or timing may cause Miss-Trigger-L2H and/or False-Trigger-H2L events, which may lead to signal distortion and error in the communication. Changes in the signal peak and/or timing may also cause Miss-Trigger-H2L and/or False-Trigger-L2H events, which may lead to increased power consumption in the line driver.

Typically, to avoid substantial changes in the signal peak and timing, at least some of the analog blocks, which may be used to convert and/or amplify the signal, may be modeled in the digital domain to modify the incoming digital signal before comparing the signal to the threshold. As such, changes in the signal, for instance due to the distortion in the phase response of the circuit blocks, may be accounted for. However, accurately modeling and accounting for the changes to the signal may require substantial processing requirements and resources. Alternatively, to avoid substantial changes in the signal peak and timing without increasing processing requirements, the incoming digital signal may be compared to a more conservative threshold to guarantee few or no Miss-Trigger-L2H and/or False-Trigger-H2L events and hence no substantial signal distortion and error in the line. Using a more conservative threshold may also increase the frequency of Miss-Trigger-H2L and/or False-Trigger-L2H events, and hence may lead to more power consumption in the line.

Disclosed herein are systems and methods for amplifying incoming signals in a wired communication system, such as a DSL system, using a line driver that may be a class-G line driver. The line driver may be configured to switch between low and a high supply voltages based on a control signal. The control signal may be generated by a control signal generator, which may determine the control signal based on an analog input or output signal of the line driver. The control signal generator may be a predictor filter that uses the analog input or output signal of the line driver to predict a peak of a future incoming analog signal and hence generate a control signal to switch between the low and high supply voltages accordingly. By predicting the peak of the future incoming signal, the low or high supply voltage may be switched in the line driver prior to the arrival of the future incoming signal. Thus, the control signal may be accurately provided to amplify and launch the incoming analog signal without additional modeling of analog circuit blocks in digital domain and without wasting additional power in the line driver.

FIG. 1 illustrates an embodiment of an amplifier system 100, which may include a class-G line driver. The amplifier system 100 may be configured to switch between a low supply voltage and a high supply voltage using a control signal. The control signal may be provided based on an incoming signal, such as an incoming analog signal. The amplifier system 100 may comprise a predictor filter 110, a first comparator 120 and a second comparator 122, a coupler gate 130, a line driver 140, and a load line (Zload) 150. The predictor filter 110 may be coupled to an input of the line driver 140, and as such both the predictor filter 110 and the line driver 140 may receive the incoming analog signal. Based on the incoming analog signal, the predictor circuit 110 may provide an output signal to each of the first comparator 120 and the second comparator 122, which may be positioned between the predictor filter 110 and the coupler gate 130, as shown in FIG. 1. Specifically, the output signal from the predictor filter 110 may be generated based on a predicted signal of a future incoming signal, as described in detail below.

The first comparator 120, the second comparator 122, and the coupler gate 130 may act as a comparator circuit, which may compare a voltage of the output signal from the predictor filter 110 to a positive reference voltage (Vrefp) and a negative reference voltage (Vrefn). Accordingly, the coupler gate 130 may provide a control signal (Vcontrol) to the line driver 140, which may be used to switch the supply voltage of the line driver 140 between a low voltage value (Vsupply Low) and a high voltage value (Vsupply High). For instance, if the voltage of the output signal from the predictor filter exceeds about Vrefp (for a positive voltage) or about Vrefn (for a negative voltage), a first value of the control signal may be provided to the line driver 140 to switch from Vsupply Low to Vsupply High. Alternatively, if the voltage of the output signal from the predictor filter drops below Vrefp (for a positive voltage) and below Vrefn (for a negative voltage), a second value of the analog control signal may be provided to the line driver 140, causing the line driver 140 to switch from Vsupply High to Vsupply Low. As such, the predictor filter 110 and the comparator circuit blocks may act as a control signal generator that determines the analog control signal based on an input of the amplifier system 100. Hence, the line driver 140 may amplify the incoming analog signal according to the switched supply voltage and provide an amplified output signal that may be transported to the Zload 150.

Figure 2:
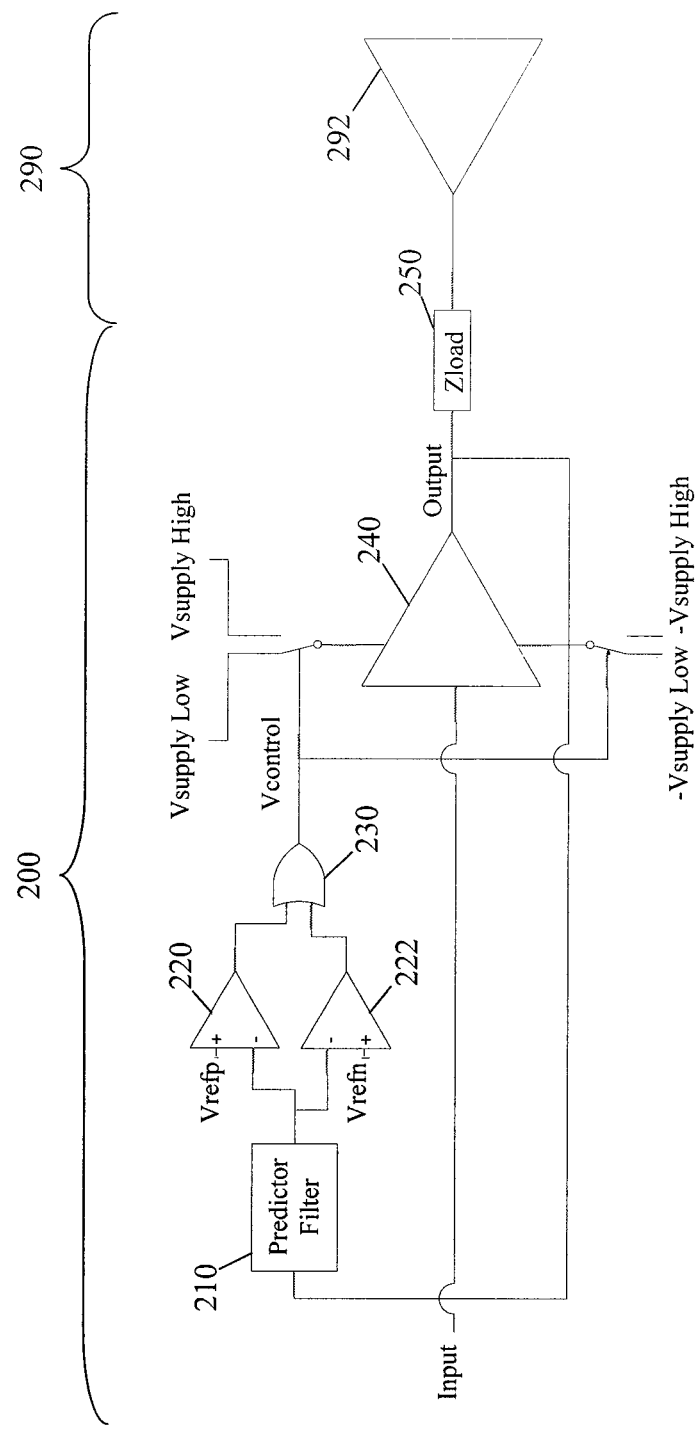
FIG. 2 is a schematic diagram of another embodiment of the amplifier system.

FIG. 2 illustrates another embodiment of an amplifier system 200, which may include a class-G line driver. The amplifier system 200 may comprise a predictor filter 210, a first 220 and a second 222, a coupler gate 230, a line driver 240, and a load line (Zload) 250, which may be configured similar to the corresponding components of the amplifier system 100. However, the amplifier system 200 may be configured to switch between a low supply voltage and a high supply voltage using a control signal, which may be provided based on an amplified output signal of the line driver 240. Specifically, the predictor filter 210 may be coupled to an output of the line driver 240, and as such may receive the amplified output signal from the line driver 240. Based on the amplified output signal, the predictor circuit 210 may provide an output signal to each of the first 220 and the second 222, which may be used by to generate the control signal (from the coupler gate 230) to switch the supply voltage of the line driver 240 from Vsupply Low and Vsupply High and vice versa. The line driver 240 may receive an incoming analog signal (e.g. without the predictor filter 210) via an input of the amplifier system 200, amplify the incoming analog signal according to the switched supply voltage, and provide the amplified output signal to the predictor filter 210 and the Zload 250.

The amplifier system 200 may be used, e.g. instead of the amplifier system 100, when the amplified output signal may be substantially attenuated by the circuit blocks and/or may have substantial phase shift with respect to the incoming signal. As such, switching the supply voltage to amplify the incoming signal may be more accurate based on the amplified output signal instead of the incoming signal. In some embodiments, such as in ADSL or VDSL systems, the amplifier system 200 may be coupled to a second remote amplifier system 290, which may be used to increase the signal level in the Zload 250 above the level of the amplified output signal from the line driver 240. For instance, the second remote amplifier system 290 may comprise a second line driver 292, that may or may not be a class-G line driver, that may have an output coupled to the Zload 250. The second remote amplifier system 290 may also comprise other circuit blocks coupled to the second line driver 292 (not shown), which may be similar or different than the circuit blocks of the amplifier system 200. The second line driver 292 may provide a second amplified output signal to the Zload 250 that may increase the signal level in the Zload 250. Alternatively, the second line driver 292 may receive, amplify, and reflect a portion of the amplified output signal from the line driver 240 into the Zload 250. The combined output signal in the Zload 250 may be used for line operations, such as to determine an impedance of the Zload 250. As such, it may be advantageous to consider the amplified output signal from the amplifier system 200, instead of the incoming signal, to switch the supply voltage of the line driver 240 as needed.

Figure 3A:
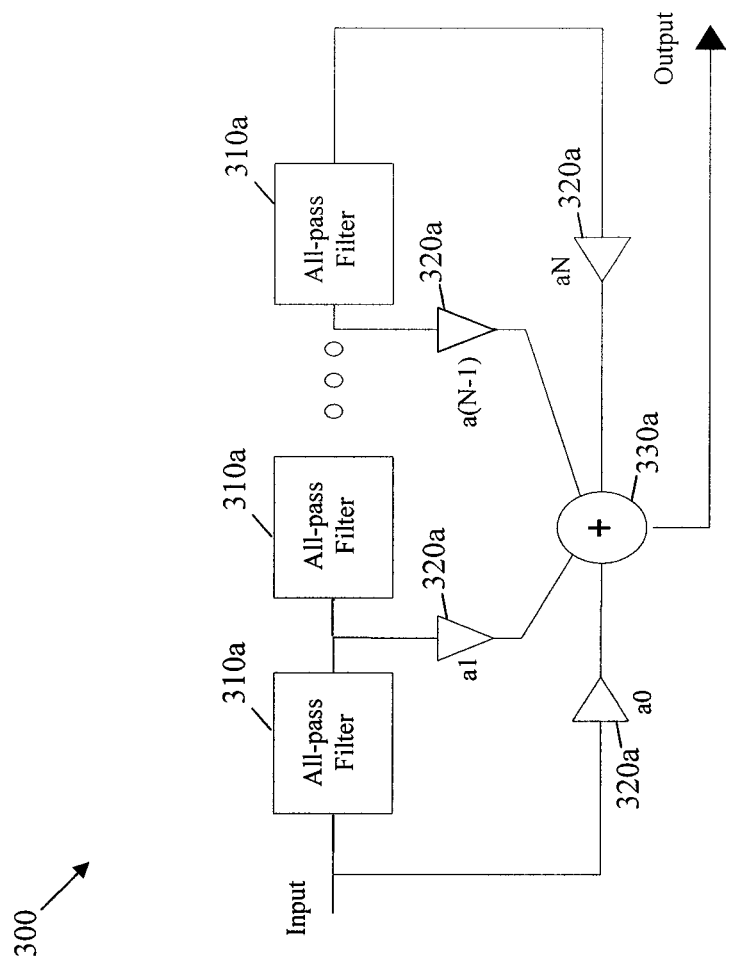
FIG. 3A is a schematic diagram of an embodiment of a predictor filter.
Figure 3B:
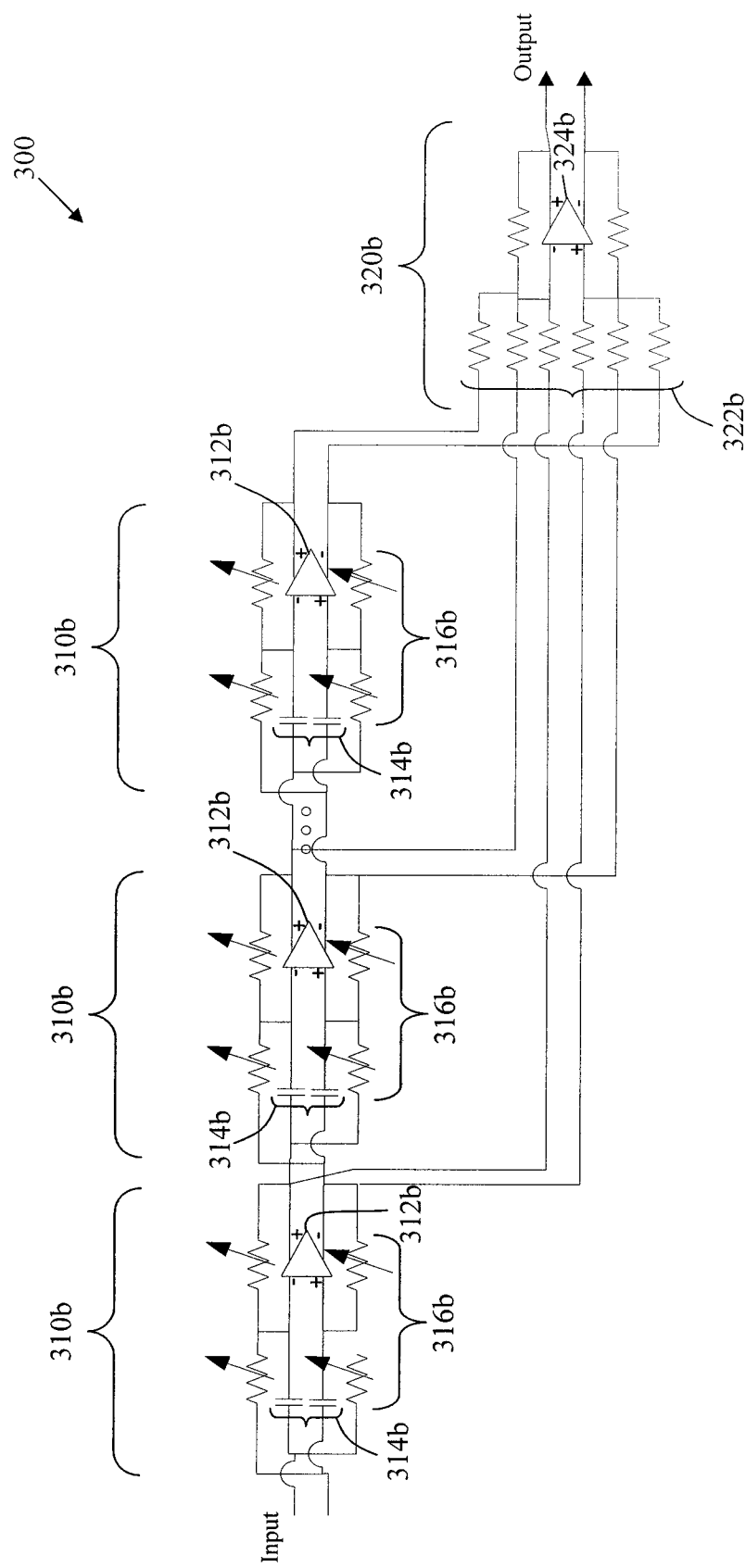
FIG. 3B is a schematic diagram of another embodiment of the predictor filter.

FIGS. 3A and 3B illustrate embodiments of a predictor filter 300 that may be used to predict a future incoming signal, such as an analog signal. For instance, the predictor filter 300 may be used in the amplifier system 100 or the amplifier system 200. The predictor filter 300 may comprise a plurality of all-pass phase delay lines, such as a plurality of cascaded phase delay blocks. FIG. 3A shows a block model of the predictor filter 300. The predictor filter 300 may comprise a plurality of N all-pass filters 310a (where N is an integer), a plurality of amplifiers 320a, and a coupler 330a. The N all-pass filters 310a may be coupled to one another, e.g. in series. The all-pass filters 310a may be substantially similar or different, and one of the all-pass filters 310a may be coupled to an input of the predictor filter 300. The input of the predictor filter 300 may be an input to the line driver 140 and may provide an incoming signal to the predictor filter 300. Alternatively, the input to the predictor filter 300 may be an output of the line driver 240.

Each of the all-pass filters 310a and the input of the predictor filter 300 may have an output that may be amplified via a corresponding amplifier 320a. The amplified outputs may all be combined via the coupler 330a, which may be coupled to an output of the predictor filter 300. For example, the amplifiers 320a may have different amplification factors (e.g. a0, a1, . . . , aN). As such, an output signal from the incoming signal of the predictor filter 300 and from each of the all-pass filters 310a may be amplified and combined to provide an output signal of the predictor filter 300. The amplified and combined output signal may be provided to a comparator circuit in the amplifier system to generate a control signal to switch a supply voltage of a line driver in the amplifier system.

FIG. 3B shows a circuit configuration that may correspond to the predictor filter 300. The predictor filter 300 may comprise a plurality of N all-pass filter circuits 310b that may be coupled to one another, e.g. in series, and a summing circuit 320b. Each of the all-pass filter circuits 310b may have an output, which may be combined with the outputs of the remaining all-pass filter circuits 310b via the summing circuit 320b. The all-pass filter circuits 310b may be coupled to an input of the predictor filter 300 and the summing circuit 320b may be coupled to an output of the predictor filter 300. The all-pass filter circuits 310b may be substantially similar or different and may each comprise an operational amplifier (Op-Amp) 312b, a plurality of capacitors 314b, and a plurality of variable resistors 316b, which may be arranged as shown in FIG. 3B. The summing circuit 320b may comprise a plurality of summing resistors 322b and an output Op-Amp 324b. In other embodiments, the all-pass filter circuits 310b and/or the summing circuit 320b may comprise additional or different circuit blocks, which may be arranged in a suitable arrangement to achieve signal predication.

The output signal of the predictor filter 300 may be a predicted signal for a future incoming signal to the amplifier system comprising the predictor filter 300. The circuit configuration of the predictor filter 300 may determine the accuracy of the predicted signal and how far into the future the incoming signal may be estimated. For example, the design of the predictor filter 300 may be improved to estimate the incoming signal arriving at a longer time in the future. The circuit configuration of the predictor filter 300 may be based on the system's physical constraints. For example, the circuit configuration of FIG. 3B may be used in systems that may not comprise an on board clock and a phase shifter to estimate the delay lines. In such systems, the predictor filter 300 may be used to estimate a delay by using a first order filter all-pass filter, e.g. one all-pass filter 310a, which may cover a range of frequencies of interest. Alternatively, a higher order all-pass filter may be used to cover a wider range of frequencies.

Figure 4A:
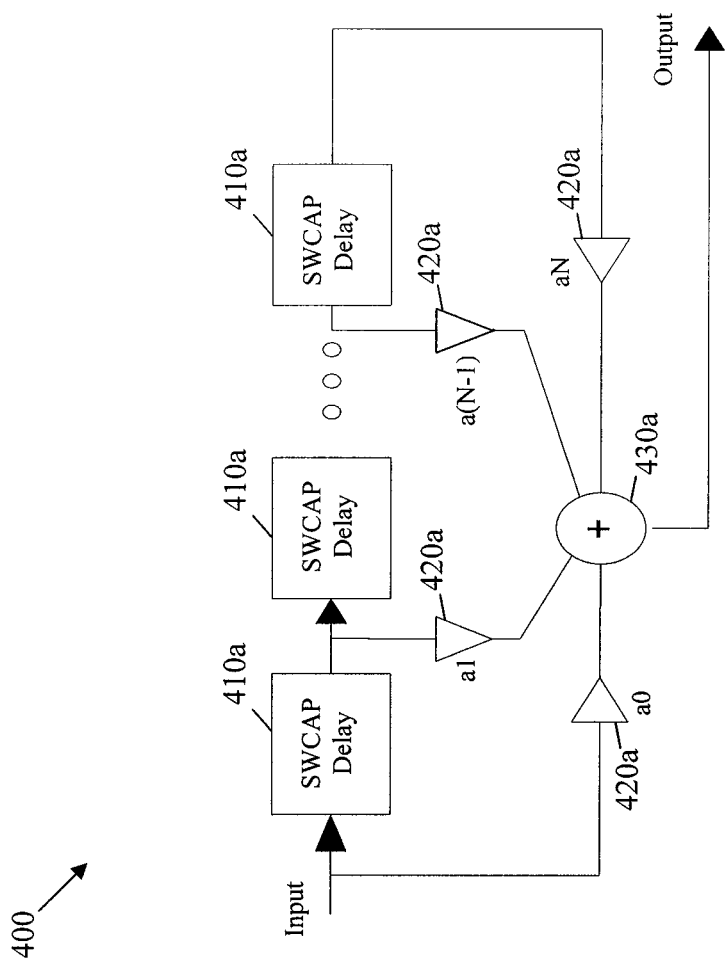
FIG. 4A is a schematic diagram of another embodiment of the predictor filter.
Figure 4B:
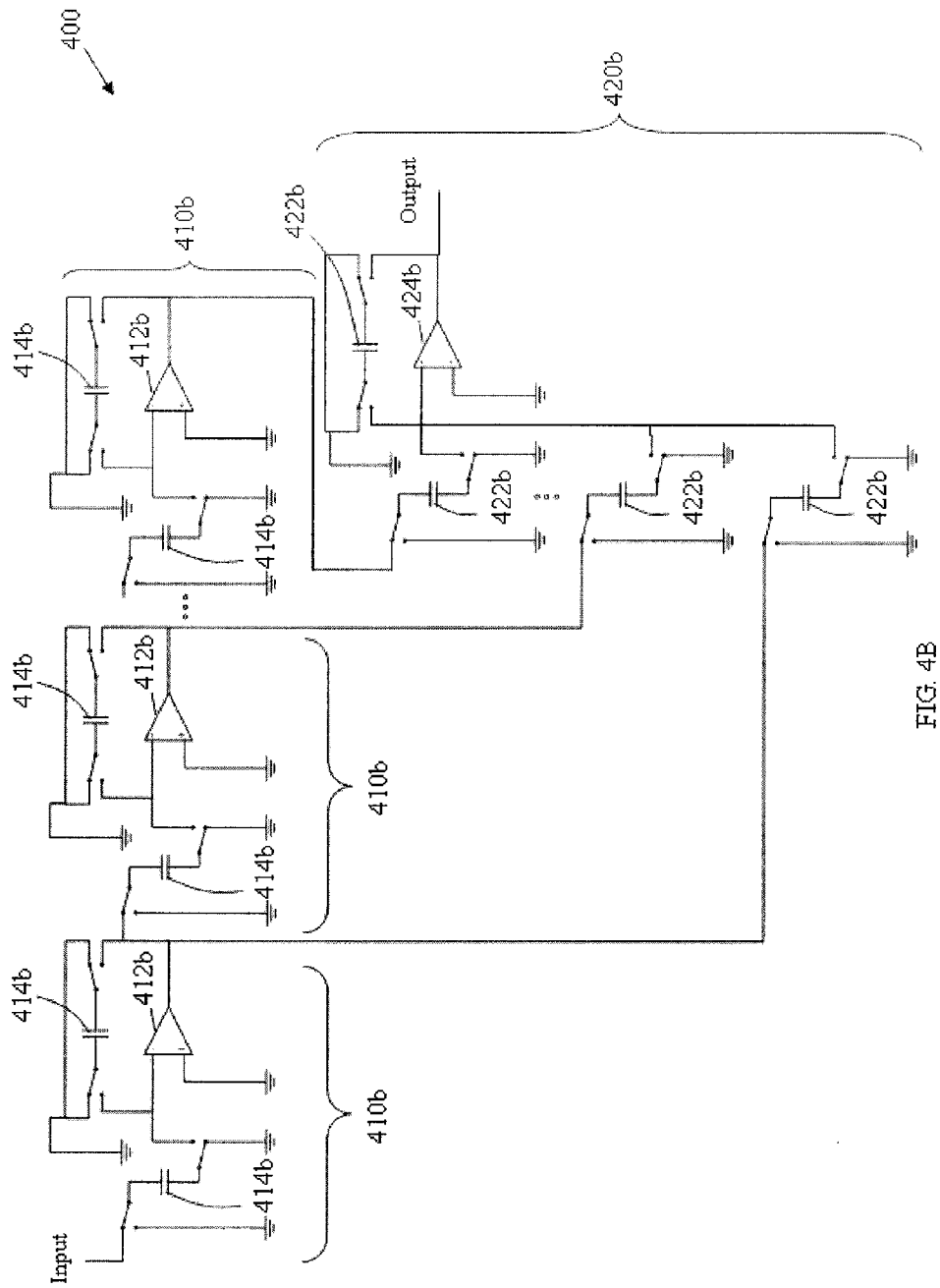
FIG. 4B is a schematic diagram of another embodiment of the predictor filter.

FIGS. 4A and 4B illustrate other embodiments of a predictor filter 400 that may be used to predict a future incoming signal, e.g. in the amplifier system 100 or the amplifier system 200. The predictor filter 400 may comprise a plurality of switched-capacitor (SWCAP) analog delay lines, such as a plurality of cascaded phase shift filters. FIG. 4A shows a block model of the predictor filter 400. The predictor filter 400 may comprise a plurality of SWCAP delay blocks 410a, a plurality of amplifiers 420a, and a coupler 430a. The SWCAP delay blocks 410a may be coupled to one another, e.g. in series. The SWCAP delay blocks 410a may be substantially similar or different and may be coupled to an input of the predictor filter 400. The input of the predictor filter 400 may be an input to the amplifier system comprising the predictor filter 400 and may provide an incoming signal to the predictor filter 400. Alternatively, the input to the predictor filter 400 may be an output of the line driver and may provide an amplified output signal to the predictor filter 400.

Each of the SWCAP delay blocks 410a and the input of the predictor filter 400 may have an output that may be amplified via a corresponding amplifier 420a. The amplified outputs may all be combined via the coupler 430a, which may be coupled to an output of the predictor filter 400. For example, the amplifiers 420a may have different amplification factors (e.g. a0, a1, . . . , aN). As such, an output signal from the incoming signal of the predictor filter 400 and from each of the SWCAP delay blocks 410a may be amplified and combined to provide an output signal of the predictor filter 400. The amplified and combined output signal may be provided to a comparator circuit in the amplifier system to generate a control signal to switch a supply voltage of an amplifier circuit in the amplifier system.

FIG. 4B shows a circuit configuration that may correspond to the predictor filter 400. The predictor filter 400 may comprise a plurality of SWCAP delay circuits 410b that may be coupled to one another, e.g. in series, and a summing circuit 420b. Each of the SWCAP delay circuits 410b may have an output, which may be combined with the outputs of the remaining SWCAP delay circuits 410b via the summing circuit 420b. The SWCAP delay circuits 410b may be coupled to an input of the predictor filter 400, and the summing circuit 420b may be coupled to an output of the predictor filter 400. The SWCAP delay blocks 410b may be substantially similar or different and may each comprise an Op-Amp 412b and a plurality of capacitors 414b, which may be arranged as shown in FIG. 4B. The summing circuit 420b may comprise a plurality of summing capacitors 422b and an output Op-Amp 424b. In other embodiments, the SWCAP delay circuits 410b and/or the summing circuit 420b may comprise additional or different circuit blocks, which may be arranged in a suitable arrangement to achieve signal filtering. The SWCAP delay circuits 410b, and similarly the SWCAP delay blocks 410b, may be configured as delay lines. As such, the predictor filter 400 may act substantially as a finite impulse response (FIR) filter in analog domain and may have similar characteristics as its counter part FIR filter in a digital domain.

Figure 5A:
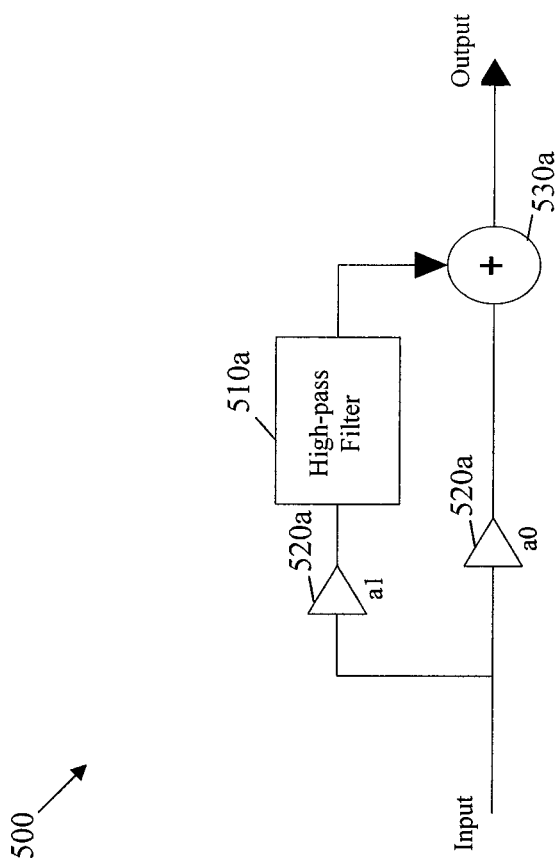
FIG. 5A is a schematic diagram of another embodiment of the predictor filter.
Figure 5B:
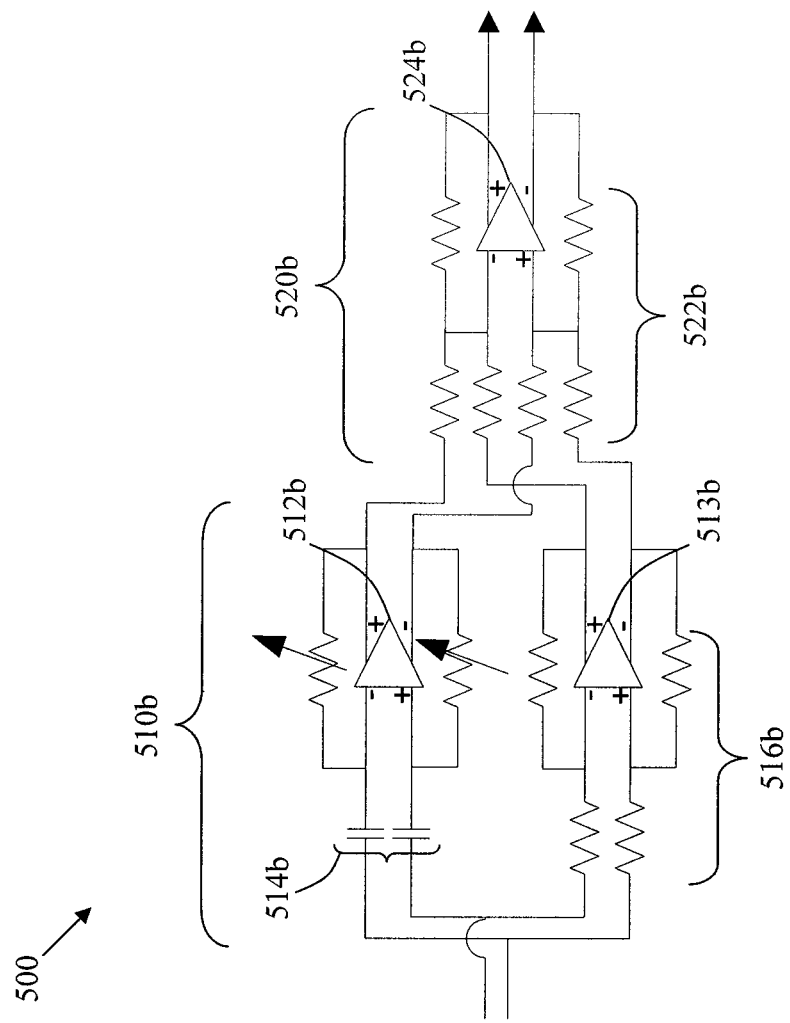
FIG. 5B is a schematic diagram of another embodiment of the predictor filter.

FIGS. 5A and 5B illustrate other embodiments of a predictor filter 500 that may be used to predict a future incoming signal, e.g. in the amplifier system 100 or the amplifier system 200. The predictor filter 500 may be an analog predictor configured for high-pass or low-pass filtering. FIG. 5A shows a block model of the predictor filter 500. The predictor filter 500 may comprise a high-pass filter 510a, a plurality of amplifiers 520a, and a coupler 530a. The high-pass filter 510a may be coupled to an input of the predictor filter 500, which may be an input to the amplifier system comprising the predictor filter 500 and may provide an incoming signal to the predictor filter 500. Alternatively, the input to the predictor filter 500 may be an output of the line driver and may provide an amplified output signal to the predictor filter 500.

The output of the high-pass filter 510a and the input of the predictor filter 500 may each be amplified via a corresponding amplifier 520a. For example, the corresponding amplifiers 520a may have different amplification factors (e.g. a0 and a1). The amplified outputs may be combined via the coupler 530a, which may be coupled to an output of the predictor filter 500. As such, an output signal from the high-pass filter 510a and the incoming signal of the predictor filter 500 may be amplified and combined to provide an output signal of the predictor filter 500. The amplified and combined output signal may be provided to a comparator circuit in the amplifier system to generate a control signal to switch a supply voltage of an amplifier circuit in the amplifier system.

FIG. 5B shows a circuit configuration that may correspond to the predictor filter 500. The predictor filter 500 may comprise a high-pass filter circuit 510b and a summing circuit 520b, which may be coupled to the high-pass filter circuit 510b. The high-pass filter circuit 510b may be coupled to an input of the predictor filter 500 and the summing circuit 520b may be coupled to an output of the predictor filter 500. The high-pass filter circuit 510b may comprise a first Op-Amp 512b and a second Op-Amp 513b, a plurality of capacitors 514b, and a plurality of resistors 516b, which may be arranged as shown in FIG. 5B. The summing circuit 520b may comprise a plurality of summing resistors 522b and an output Op-Amp 524b. In other embodiments, the high-pass filter 510b and/or the summing circuit 520b may comprise additional or different circuit blocks, which may be arranged in a suitable arrangement to achieve signal filtering.

The high-pass filter circuit 510b, and similarly the high-pass filter 510a, may be a passive filter configured to estimate a future level or peak of the incoming signal. Using a high-pass filter in the predictor filter 500 may increase the response time and/or decrease the power consumption of the circuit in the line driver, e.g. in comparison to the predictor circuit 400 and the predictor circuit 300, and as such may be suitable for high bandwidth systems. The predictor filter 500 may use high-pass filtering and signal summation to estimate a future value of the incoming signal. As such, the high-pass filter may act as a differentiator, which may predict a future value of the incoming signal using a proper gain. For instance, the high-pass filter may add a differentiated signal to its current value. Alternatively, higher order high-pass filtering may be used, such as using the predictor filter 300 or the predictor filter 400, to predict a more accurate future value and/or a value at a further time. Higher order high-pass filtering may be achieved by combining a plurality of different orders of high-pass filters, e.g. a first order, a second order, and/or any higher order high-pass filters. Combining the different orders of high-pass filters may be equivalent mathematically to adding a plurality of corresponding orders of derivatives, as described below.

In an embodiment, a plurality of filters may be implemented in analog domain as described above, e.g. in a cascade format, to establish a predictor filter. A plurality of derivative orders of the signal, such as a first order derivative, a second order derivative, and higher order derivatives, may be used to approximate a future value of the signal. A first order derivative of the signal may be represented by:

$$f(t)' = \frac{f(t + \Delta t) - f(t)}{\Delta t},$$

where f(t)' is the first order derivative of the signal at time t, and Δt is a time step. The expression above may be written in terms of the future value of the signal in time, f(t+Δt):

$$f(t+\Delta t) = f(t) + f(t)' \Delta t.$$

Accordingly, the future signal value in time may be obtained by adding the current signal value to a product of the first order derivative of the signal and the time step. The future value of the signal may be predicted if the difference between the values is sufficiently small.

In an embodiment, the time step may correspond to a gain adjustment in the predictor circuit, which may comprise a high-pass filter in the frequency range of interest. The output of the high-pass filter may be multiplied by a constant scale factor for gain adjustment, and then added to the current signal. Further, to improve future signal estimation, e.g. for better accuracy and/or longer future time prediction, the signal may be estimated using additional higher order derivatives. For instance a Taylor series may be used to estimate the signal based on additional higher order derivatives:

$$f(t + \Delta t) = f(t) + f(t)' \Delta t + \frac{f(t)'' \Delta t^2}{2} + \frac{f(t)''' \Delta t^3}{3!} + \ldots$$

For example, the predictor circuit 500 comprises a first order filter and an amplifier that correspond to the first two terms of the Taylor series. Specifically, the first Op-Amp 512b and the capacitors 514b may compute the derivative of the signal, the second Op-Amp 513b and the resistors 516b may amplify the signal, and the summing circuit 520b may add the amplified signal and the derivative of the signal to provide the future value of the signal. Similarly, additional higher order terms may be computed and added in the predictor filter to improve the prediction of the future signal.

Figure 6:
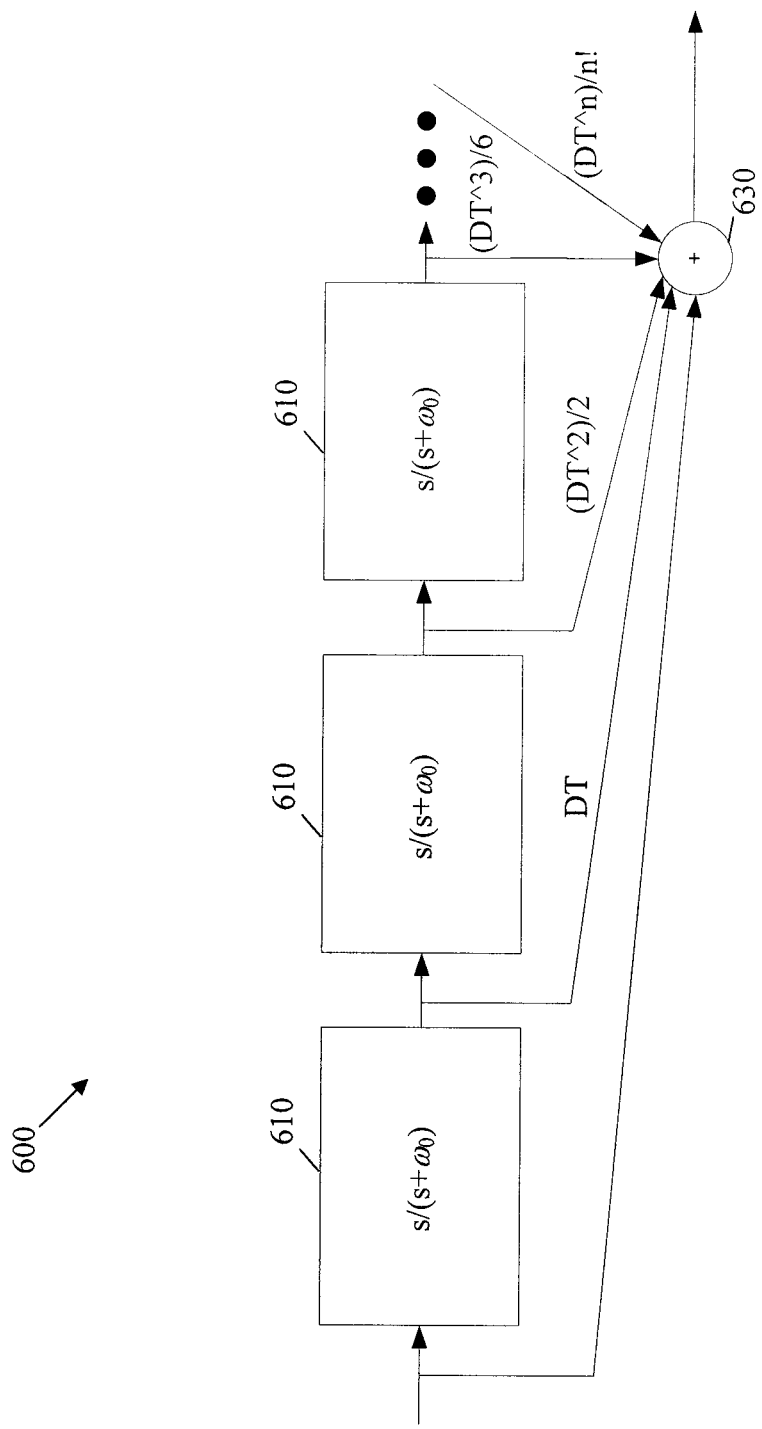
FIG. 6 is a schematic diagram of another embodiment of the predictor filter.

FIG. 6 illustrates another embodiment of a predictor filter 600 that may be used to predict a future incoming signal, e.g. in the amplifier system 100 or the amplifier system 200. Specifically, FIG. 6 shows a block model of the predictor filter 600. The predictor filter 600 may comprise a plurality of consecutive higher order filters 610, e.g. at least about three filters, which may be configured for high-pass filtering. The higher order high-pass filters 610 may be cascaded in series. The predictor filter 600 may also comprise a coupler 630, which may be connected to each of the first order high-pass filters 610. The first order high-pass filters 610 may be coupled to an input of the predictor filter 600, which may be an input to the amplifier system comprising the predictor filter 600 and may provide an incoming signal to the predictor filter 600. Alternatively, the input to the predictor filter 600 may be an output of the line driver and may provide an amplified output signal to the predictor filter 600.

The linear cascading scheme shown in FIG. 6 for the first order high-pass filters 610 may establish higher order high-pass filters and hence higher order derivatives, which may correspond to the Taylor series above. Specifically, the output of each of the first order high-pass filters 610 in the sequence of filters may correspond to a next high order term. As such, the outputs (e.g. higher order derivatives or terms) of the filters may be combined by the coupler 630 to generate a Taylor series function at the output of the predictor filter 600.

Figure 7:
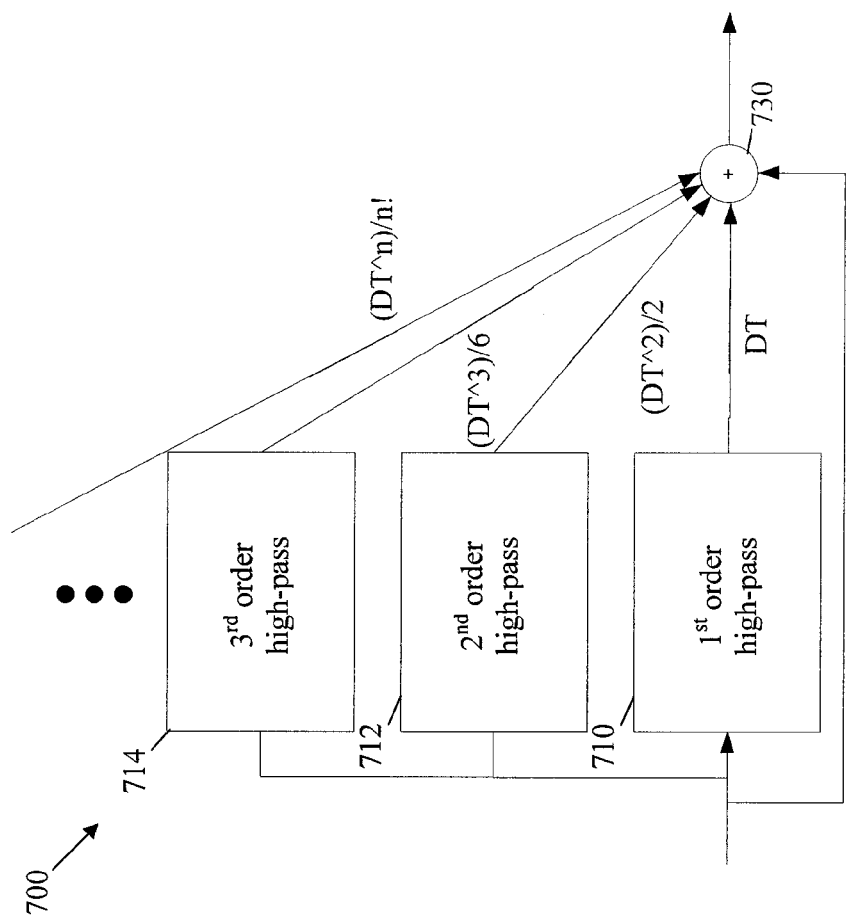
FIG. 7 is a schematic diagram of another embodiment of the predictor filter.

FIG. 7 illustrates another embodiment of a predictor filter 700 that may be used to predict a future incoming signal, e.g. in the amplifier system 100 or the amplifier system 200. Specifically, FIG. 7 shows a block model of the predictor filter 700. The predictor filter 700 may comprise a plurality of consecutive higher order filters, which may be configured for high-pass filtering. The higher order high-pass filters may include a first order high-pass filter 710, a second order high-pass filter 712, a third order high-pass filter 714, and up to a $n^{th}$ order high-pass filter, where n is an integer greater than or equal to about three. The n high-pass filters may be cascaded in parallel as shown in FIG. 7. The predictor filter 700 may also comprise a coupler 730, which may be connected to each of the n high-pass filters. Further, the n high-pass filters may be coupled to an input of the predictor filter 700, which may be an input to the amplifier system comprising the predictor filter 700 and may provide an incoming signal to the predictor filter 700. Alternatively, the input to the predictor filter 700 may be an output of the line driver and may provide an amplified output signal to the predictor filter 700. The parallel cascading scheme shown in FIG. 7 for the n high-pass filters may provide n higher order high-pass filters and hence n higher order derivatives, which may correspond to the Taylor series above. As such, the output of each of the n high-pass filters may be combined by the coupler 730 to generate a Taylor series function at the output of the predictor filter 700.

The circuit architectures and designs above for the predictor filter comprise analog blocks or cells that may be used to process and convert analog signals. In other embodiments, the predictor filter may comprise digital circuit blocks or components that may process and convert digital signals. However, the analog design may be more advantageous in some cases, e.g. for systems that may not have access to digital signal processing (DSP) and/or where the signal sampling rates may be too high and therefore processing the signal may not be feasible. In such cases, the analog design may be preferred. The analog design also provides feasibility of integration into the line driver itself.

For practical consideration, any of the predictor filters above may be established using integrated circuit technologies, such as complementary metal-oxide-semiconductor (CMOS) technology. Typically, the analog (or digital) signals processed by the predictor filters may have substantially high peaks with respect to noise, and therefore may not require substantially large capacitor areas. In some embodiments, such as in the case of a continuous time analog filter, a calibration circuit may also be used to calibrate the filter's corner frequency to a determined center frequency. Further, the output signal of the predictor filter may comprise an offset, which may cause an error in evaluating the peak of the incoming signal (with respect to the threshold) to switch the supply voltage. However, in most cases, the output signal's offset may not be too large to cause a substantial error in evaluating the incoming signal's peak and hence may be ignored. Alternatively, if the offset is large enough to cause a significant error, an offset cancelling block may also be used with the predictor filter.

The prediction filter in the amplifier system, e.g. the predictor filter 300, the predictor filter 400, or the predictor filter 500, may be configured for signal filtering to provide an output signal, which may be a prediction function for a future incoming signal to the line driver. For example, the filter may be based on a Weiner filter design, which may have a plurality of Wiener-Hopf coefficients. The Wiener-Hopf coefficients may be calculated using a matrix equation:

$$T*A = V,$$

where T is an auto-correlation matrix of the input signal to the predictor filter, A is a vector that comprises the Wiener-Hopf coefficients, and V is an auto-correction vector of the signal. Accordingly, the filter may be represented by:

$$X(n) = a(n-1)*X(n-1) + a(n-2)*X(n-2) + \ldots + a(0)*X(0),$$

where a(n) is the quantity of the $n^{th}$ coefficient used. The filter above may be a FIR filter with the coefficient a(n−1), a(n−2), ..., a(0). In the case of a SWCAP filter, such as the predictor filter 400, a plurality of summing capacitors (e.g. summing capacitors 422b) may provide the coefficients of the filter. Accordingly, each delay section in the filter may be implemented as a charge holding capacitor, which may be a voltage for a next delay section. In the case of an all-pass filter, such as the predictor filter 300, the transfer function for a single pole may be represented by:

$$H(s) = \frac{1 - \frac{\omega_0}{s}}{1 + \frac{\omega_0}{s}}.$$

The transfer function may have a gain equal to about −1 for low frequencies near Direct Current (DC) and equal to about +1 at relatively high frequencies.

In an embodiment, the predictor filter may comprise a digital filter comprising an analog to digital converter (ADC) coupled to the amplifier system input. In such as case, the digital filter may be configured to sample the input or the control signal generator output, implement a transfer function digitally, and create a control signal based on the transfer function.

Figure 8:
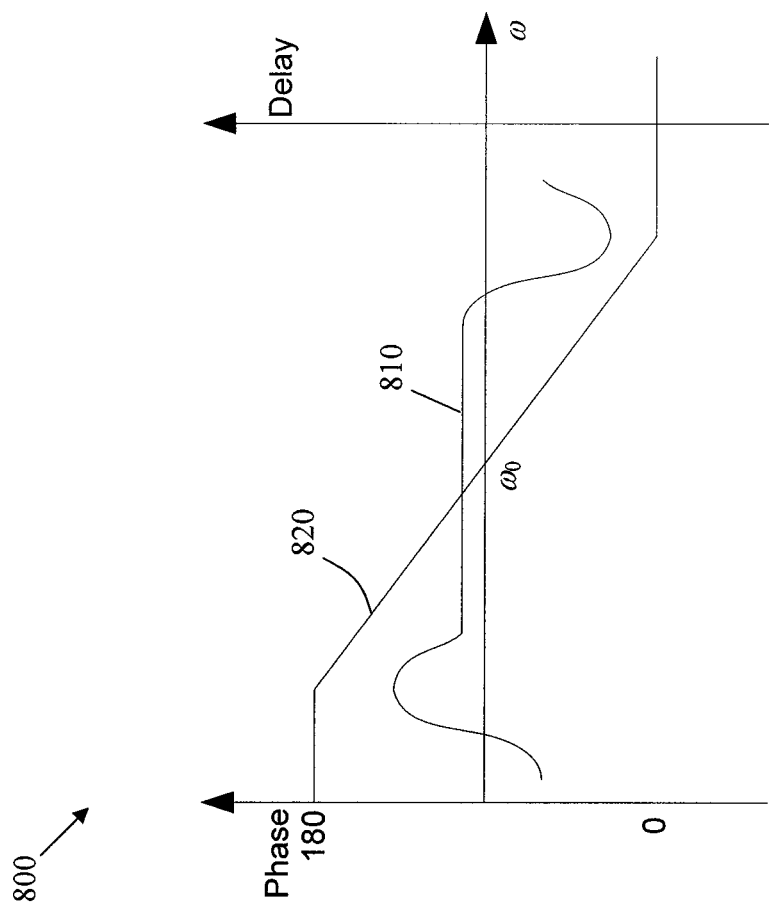
FIG. 8 is a plot of an embodiment of a filter transfer function.

FIG. 8 illustrates an embodiment of a transfer function 800 phase and delay for an all-pass filter. The transfer function 800 may be a phase transfer function of a single pole all-pass filter. The phase transfer function may be represented by a curve 820 that comprises a plurality of points. The points correspond to phase values vs. a range of angular frequencies. The curve 820 may comprise a substantially linear portion around the middle of the range of frequencies, e.g. where the phase values may be changing at about the same rate versus frequency. Accordingly, the delay of the filter 810, which is the derivative of phase function with respect to frequency, may be substantially constant at about the same range of frequencies, and hence may approximate an analog delay line. The coefficients of the delay line may be calculated using a Pade polynomial:

$$z^{-1} = e^{-sT} = \frac{1 - \frac{ST}{2} + \frac{3(ST)^2}{28} - \frac{(ST)^2}{2884} + \ldots}{1 + \frac{ST}{2} - \frac{3(ST)^2}{28} + \frac{(ST)^2}{2884} - \ldots}.$$

In the case of a relatively narrow band signal, where the frequency band of interest may not be substantially far from the center frequency, the above expression may be further approximated as:

$$z^{-1} = e^{-sT} \approx \frac{1 - \frac{ST}{2}}{1 + \frac{ST}{2}} = \frac{\frac{2}{ST} - 1}{\frac{2}{ST} + 1} = \frac{1 - \frac{\omega_0}{s}}{1 + \frac{\omega_0}{s}},$$

where $\omega_0$ is a center frequency at about the middle of the range of frequencies. Based on this approximation of the transfer function, a delay line in analog domain may he established using an all-pass filter.

The transfer function and its coefficients, which may be FIR coefficients, may be implemented using a summing circuit (e.g. summing circuit 320b). In the case of a relatively wider band signal, the approximation of the delay line or block may require using a higher order all-pass filter, which may be calculated using a Pade polynomial with higher terms. In other embodiments, the all-pass filter may be calculated using polynomials other than the Pade polynomial. Additionally, a Bessel filter or other linear phase filters may be used to implement delay line in the band of interest that will attenuate the signal outside the band of interest.

In some embodiments, an adaptive predictor filter may be used to adapt to the dynamic requirements of the system. For instance, the adaptive predictor filter may comprise variable resistors, which may be programmable. A state machine may be used to calculate the coefficients of the predictor filter, and hence adjust the filter parameters properly. In an analog predictor filter, calculating the coefficients may not require substantially high speed as long as the adjustments to the coefficients may track the dynamics of the system.

Figure 9:
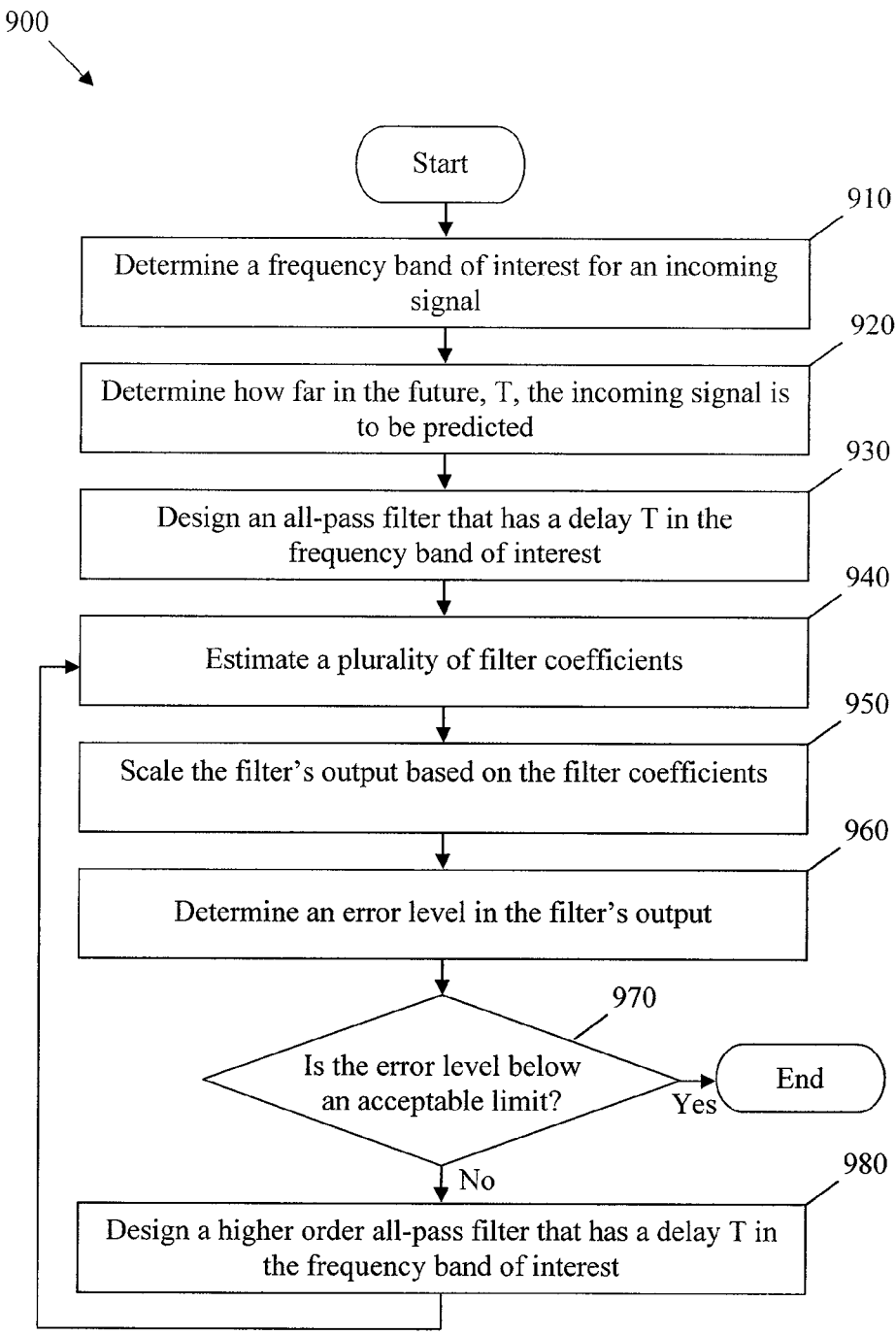
FIG. 9 is a flowchart of an embodiment of a predictor filter design method.

FIG. 9 illustrates an embodiment of a predictor filter design method 900, which may be used to design a predictor filter based on cascaded all-pass filters, such as the predictor filter 300. The predictor filter may be implemented in analog domain. The predictor filter design method 900 may begin at block 910, where a frequency band for an incoming signal (e.g. analog signal) may be determined. Next at block 920, it may be determined how far in the future (T) the incoming signal is to be predicted. For example, an amount of time in the future may be selected to predict the peak of the next incoming signal, e.g. at about few fractions of a second. At block 930, an all-pass filter that has a delay T in the frequency band of interest may be designed. For example, the delay may be equal to about the determined amount of time in the future. In an embodiment, the all-pass filter may be designed using an analog design program to derive the filter coefficients. At block 940, a plurality of filter coefficients may be estimated. For example, a digital filter design tool may be used to estimate the Weiner-Hopf filter coefficients. At block 950, the filter's output may be scaled based on the filter coefficients, for instance using at least one resistor. For example, the summing resistors 322b may be configured to scale the output of the predictor filter 300 properly.

Next at block 960, the error level in the filter's output may be determined. For example, the predictor filter operation may be simulated to evaluate the error level of the output signal, e.g. due to nonlinearity of the phase in the system. At block 970, the method 900 may determine whether the error level is below an acceptable limit. The method 900 may then end if the error level is found to be below the acceptable limit. Alternatively, if the error level is found to be above the acceptable limit, the method 900 may proceed to block 980. At block 980, a higher order all-pass filter that has a delay T in the frequency band of interest may be designed. For example, a next higher order term may be added to the previously designed all-pass filter. Next, the method 900 may return to block 940 to estimate the filter coefficients including a coefficient corresponding to the added higher order term. The method 900 may then proceed through the remaining blocks, as described above.

Figure 10:
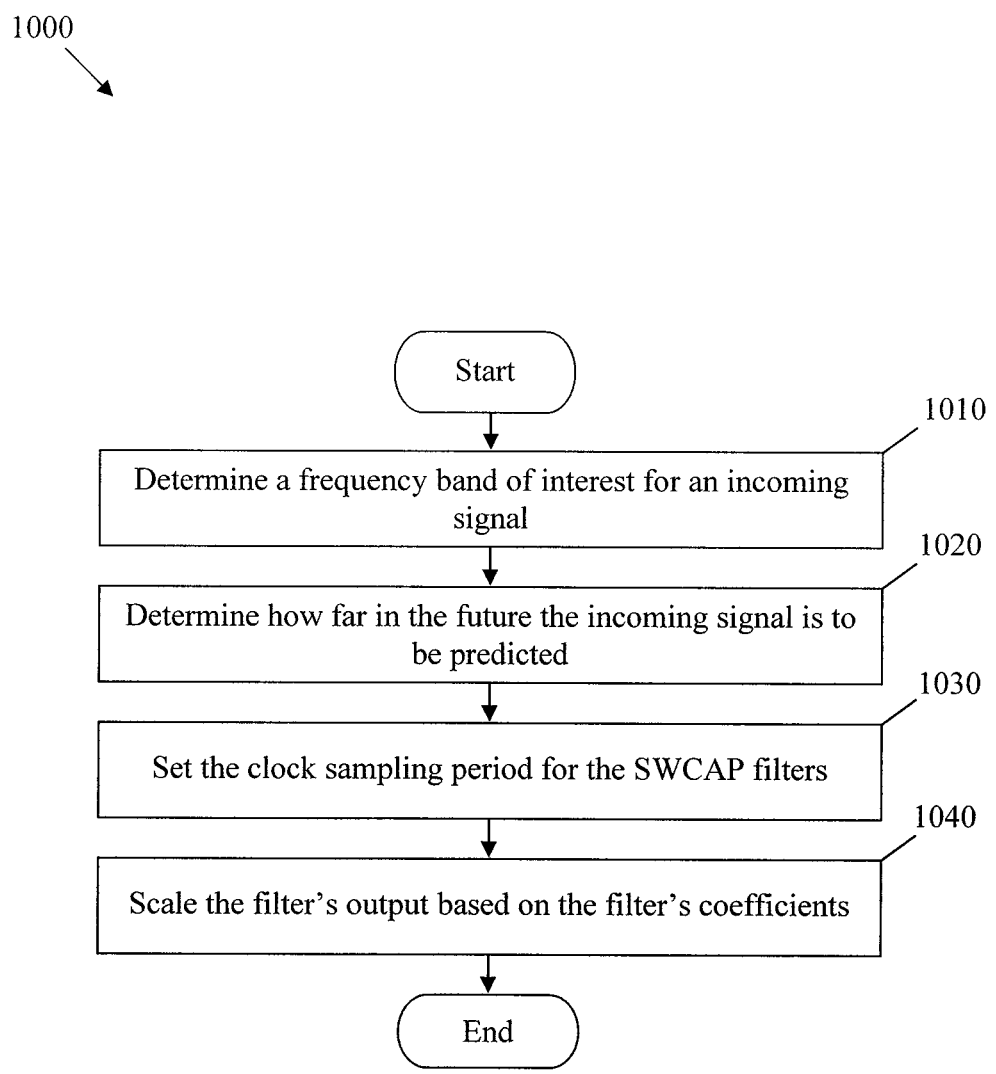
FIG. 10 is a flowchart of another embodiment of a predictor filter design method.

FIG. 10 illustrates an embodiment of a predictor filter design method 1000, which may be used to design a predictor filter based on cascaded SWCAP circuits, such as the predictor filter 400. The predictor filter design method 1000 may begin at block 1010, where a frequency band for an incoming signal (e.g. analog signal) may be determined. Next at block 1020, it may be determined how far in the future the incoming signal is to be predicted. For example, a future amount of time may be defined to predict the next incoming signal. At block 1030, the clock sampling period may be set for the SWCAP filters. For example, the clock sampling period may be equal to about the determined amount of future time. At block 1040, the filter's output may be scaled based on the filter's coefficients, for instance using at least one capacitor. For example, the summing circuit 420b may be configured to scale the output of the predictor filter 400 properly. In some embodiments, the error level in the filter's output may be determined and if the error level is found unacceptable a higher order filter may be designed, e.g. by cascading an additional SWCAP circuits.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, ..., 50 percent, 51 percent, 52 percent, ..., 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An apparatus comprising:
   an input;
   a control signal generator coupled to the input and having a control signal generator output; and
   an amplifier coupled to the control signal generator output,
   wherein the control signal generator comprises a predictor filter coupled to the input and a comparator circuit positioned between the predictor filter and the amplifier,
   wherein the comparator circuit comprises a coupler gate coupled to the amplifier,
   wherein a voltage supplied to the amplifier is switched based on the control signal generator output, and
   wherein the control signal generator output is based on a data signal in the input.

2. The apparatus of claim 1, wherein the predictor filter comprises:
   at least one high-pass filter coupled to the input and having a high-pass filter input and a high-pass filter output;
   wherein each high-pass filter comprises a gain that is set at the high-pass filter input, and
   wherein when there are a plurality of the high-pass filters, all the high-pass filter outputs are summed together to create a predicted future signal.

3. The apparatus of claim 1, wherein the comparator circuit further comprises:
   a first, comparator and a second comparator coupled to the predictor filter, wherein the coupler gate is coupled to the first comparator, and the second comparator.

4. The apparatus of claim 1, wherein the input is directly connected to the amplifier without any intervening components.

5. The apparatus of claim 1, wherein the input is an analog signal and the predictor filter comprises an analog block configured to process the input.

6. The apparatus of claim 1, wherein the input carries an analog signal.

7. The apparatus of claim 1, wherein the predictor filter comprises:
a high-pass filter circuit coupled to the input; and
a summing circuit coupled to the high-pass filter circuit.

8. An apparatus comprising:
an input;
a predictor filter having a predictor filter output; and
an amplifier coupled to the predictor filter output and the input,
wherein the input is directly connected to the amplifier without any intervening components,
wherein the predictor filter is coupled to an output from the amplifier, and
wherein a voltage supplied to the amplifier is switched based on the predictor filter output.

9. An apparatus comprising:
an input; a predictor filter having a predictor filter output; and an amplifier coupled to the predictor filter output and the input; and
at least one high-pass filter coupled to the input and having a high-pass filter input and a high-pass output,
wherein the predictor filter is coupled to an output from the amplifier, wherein a voltage supplied to the amplifier is switched based on the predictor filter output,
wherein each high-pass filter comprises a gain that is set at the high-pass filter input, and
wherein when there are a plurality of the high-pass filters, all the high-pass filter outputs are summed together to create a predicted future signal.

10. The apparatus of claim 8, further comprising:
a first comparator and a second comparator coupled to the predictor filter and positioned between the predictor filter output and the amplifier; and
a coupler gate coupled to the first comparator, the second comparator, and the amplifier and positioned between the first and second comparators and the amplifier.

11. The apparatus of claim 8, wherein the predictor filter output is based on a data signal in the input.

12. An apparatus comprising:
an input;
a control signal generator having a control signal generator output; and
an amplifier coupled to the control signal generator output and the input,
wherein the input is directly connected to the amplifier without any intervening components,
wherein the control signal generator comprises a predictor filter and a comparator circuit positioned between the predictor filter and the amplifier,
wherein the predictor filter is coupled to an output of the amplifier, and
wherein a voltage supplied to the amplifier is switched based on the control signal generator output.

13. The apparatus of claim 12, wherein the predictor filter comprises:
at least one high-pass filter coupled to the input and having a high-pass filter input and a high-pass filter output;
wherein each high-pass filter comprises a gain that is set at the high-pass filter input, and
wherein when there are a plurality of the high-pass filters, all the high-pass filter outputs are summed together to create a predicted future signal.

14. The apparatus of claim 12, wherein the comparator circuit comprises:
first comparator and a second comparator coupled to the predictor filter and positioned between the predictor filter and the amplifier; and
a coupler gate coupled to the first comparator, the second comparator, and the amplifier and positioned between the first and second comparators and the amplifier.

15. The apparatus of claim 12, wherein the control signal generator output is based on a data signal in the input.

16. An apparatus comprising:
an input; a control signal generator having a control signal generator output; and an amplifier coupled to the control signal generator output and the input,
wherein the control signal generator comprises a predictor filter and a comparator circuit positioned between the predictor filter and the amplifier,
wherein the predictor filter is coupled to an output, of the amplifier, and wherein a voltage supplied to the amplifier is switched based on the control signal generator output, and
wherein the predictor filter comprises:
a high-pass filter circuit coupled to the input; and
a summing circuit coupled to the high-pass filter circuit.

17. The apparatus of claim 16, wherein the high-pass filter circuit comprises a first operational amplifier and a second operational amplifier connected in parallel with the first operational amplifier, and wherein the summing circuit is configured to add outputs of the first operational amplifier and the second operational amplifier.

* * * * *